(12) United States Patent
Cherubini et al.

(10) Patent No.: US 7,096,411 B2
(45) Date of Patent: Aug. 22, 2006

(54) METHOD AND APPARATUS FOR RELIABLE RESYNCHRONIZATION OF SEQUENTIAL DECODERS

(75) Inventors: Giovanni Cherubini, Ruschlikon (CH); Malcolm Ware, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 640 days.

(21) Appl. No.: 10/428,667

(22) Filed: May 2, 2003

(65) Prior Publication Data

US 2006/0026493 A1     Feb. 2, 2006

(30) Foreign Application Priority Data

May 7, 2002    (EP)   ................................. 02368048

(51) Int. Cl.
     *H03M 13/03*      (2006.01)
(52) U.S. Cl. .................. 714/791; 714/794; 714/796; 375/341; 375/262
(58) Field of Classification Search ................ 714/791, 714/794, 796; 375/341, 262
See application file for complete search history.

(56) References Cited

U.S. PATENT DOCUMENTS

| | | | | |
|---|---|---|---|---|
| 5,642,369 A | * | 6/1997 | Yagi | ........................... 714/789 |
| 5,710,785 A | * | 1/1998 | Yagi | ........................... 714/789 |
| 5,946,328 A | * | 8/1999 | Cox et al. | ................... 714/784 |
| 6,690,752 B1 | * | 2/2004 | Beerel et al. | ............... 375/341 |
| 6,701,483 B1 | * | 3/2004 | Heegard et al. | ............ 714/791 |
| 6,725,417 B1 | * | 4/2004 | Shimada et al. | ............ 714/791 |
| 6,892,343 B1 | * | 5/2005 | Sayood et al. | .............. 714/779 |

\* cited by examiner

*Primary Examiner*—Guy Lamarre
*Assistant Examiner*—Esaw Abraham
(74) *Attorney, Agent, or Firm*—Douglas W. Cameron

(57) ABSTRACT

A system and method for the resynchronization of a sequential decoder that decodes received signal samples stored within an input buffer is disclosed. The system comprises two auxiliary decoders coupled to the sequential decoder for running a simplified MAP decoding process when the input buffer reaches a threshold saturation level. Control of the respective increments of a read pointer and a write pointer allows one to detect the saturation of the input buffer and to derive a sequence of signal samples to the appropriate auxiliary decoder. The selected auxiliary decoder estimates a resynchronization state for the sequential decoder based on the sequence of signal samples. According to the read and the write pointers value, normal sequential decoding is resumed, otherwise, the second auxiliary decoder is selected. The selected auxiliary decoder estimates a resynchronization state for the sequential decoder based on a new sequence of signal samples.

12 Claims, 1 Drawing Sheet

US 7,096,411 B2

METHOD AND APPARATUS FOR RELIABLE RESYNCHRONIZATION OF SEQUENTIAL DECODERS

TECHNICAL FIELD

The present invention relates to sequential decoders in general and in particular to a method and system for resynchronization of sequential decoders.

BACKGROUND OF THE INVENTION

Coding techniques are of fundamental importance for the reliable transmission of information over physical channels. The redundancy introduced by an encoder at the transmitter allows the decoder at the receiver to recover the sequence of information bits with a probability of error significantly smaller than that achieved by transmission systems that do not resort to coding techniques. An example of a technology that employs coding to achieve reliable data transmission is given by the contemporary Single-Pair High-Speed Digital Subscriber Line (SHDSL), for transmission at data rates of up to 2.32 Mbit/s over standard telephone lines in customer service areas.

We usually distinguish two broad classes of coding techniques, each with several subclasses, one employing block codes and the other convolutional codes. All coding techniques add redundancy, in the form of additional bits, to the information bits that must be transmitted. Redundancy makes possible the recovery of information bits with high reliability. The effectiveness of a coding technique is expressed in terms of the coding gain, given by the difference between the signal-to-noise ratios, in dB, that are required to achieve a certain bit error probability for transmission without and with coding.

Convolutional codes are a subclass of the class of tree codes, so named because their code words can be conveniently represented as sequences of nodes in a tree. A convolutional code may be described in terms of a tree, trellis, or state diagram. Tree codes are of great interest because decoding algorithms have been found that are easy to implement, and can be applied to the entire class of tree codes, in contrast to decoding algorithms for block codes, each designed for a specific class of codes, as for example Reed-Solomon codes.

Convolutional codes are usually characterized by two parameters, the code rate $R_C$ and the constraint length v. The code rate is given by the ratio between the number of information bits k and the number of code bits n that are generated per encoder cycle. Therefore the code rate is given by $R_C = k/n$. A convolutional encoder may be represented as a finite state machine that determines the output bits and the next state depending on the input bits and the current state. The current state is identified by the bits input to the encoder during the previous v cycles. Therefore the constraint length v is proportional to the number of binary storage elements of the encoder, and the number of states of the encoder is $2^{kv}$. The encoder output bits generated per encoder cycle may be transmitted using a binary modulation scheme, for example binary phase shift keying (BPSK), or mapped to a symbol of a multilevel constellation prior to transmission by a multilevel modulation scheme, for example pulse amplitude modulation (PAM) or quadrature amplitude modulation (QAM). The time interval required for the transmission of a symbol is usually denoted as modulation interval.

At the receiving side, the sequence of transmitted code symbols, or equivalently the sequence of encoder states, is detected using a decoding algorithm. The most widely used decoding algorithms are the Fano algorithm for sequential decoding, the Viterbi algorithm for maximum likelihood decoding, and the forward-backward algorithm, also known as the BCJR algorithm, for maximum a posteriori (MAP) probability decoding. The information bits are then recovered from the detected sequence.

In U.S. Pat. No. 3,457,562 to Robert M. Fano, there is disclosed a basic sequential decoder implementing the Fano algorithm. Sequential decoding represents an attractive technique for the decoding of convolutional codes or trellis codes in case the number of states of the encoder is large. In the Fano algorithm, the sequential decoder explores one path of a decoder tree at a time. The decoder tree is developed using the knowledge of the encoder finite state machine. In particular, each branch is labeled with the code bits or code symbol that would be transmitted in case of a transition of the encoder finite state machine from the state corresponding to the node at which the branch originates to the state corresponding to the node at which the branch ends. Three types of moves are allowed: forward, lateral, and backward. On a forward move, the decoder goes one branch to the right in the decoder tree from the previously hypothesized node. On a lateral move, the decoder goes from a node on the tree to another node differing only in the last branch. The ordering among the nodes is arbitrary, and a lateral move takes place to the next node in order after the current one. A backward move is a move one branch to the left on the tree. To determine which move needs to be made after reaching a certain node, it is necessary to compute the metric $\Gamma_i$ of the current node being hypothesized, and consider the value of the metric $\Gamma_{i-1}$ of the node one branch to the left of the current node, as well as the current value of a threshold $T_i$, which can assume values that are multiple of a given constant $\Delta$. The metric of a node is obtained by summing the metrics of the branches on the path leading to that node. The branch metric represents the distance between the noisy received signal and the code symbol with which a branch is labeled.

The Viterbi algorithm was proposed by Andrew J. Viterbi, as described in "Error bounds for convolutional codes and an asymptotically optimum decoding algorithm" published in the IEEE Transactions on Information Theory, volume IT-13, April 1967, pp. 260–269. The Viterbi algorithm is a maximum-likelihood decoding procedure that explores in parallel every possible code sequence. Metrics are given by the Euclidean distances between the received signal and the code symbol sequences.

A solution to the general problem of estimating the a posteriori probabilities of the states and transitions of a finite state machine observed through a noisy channel is obtained by the forward-backward algorithm proposed by L. R. Bahl, J. Cocke, F. Jelinek, and J. Raviv in "Optimal decoding of linear codes for minimizing symbol error rate," published in the IEEE Transactions on Information Theory, vol. IT-20, pp. 284–287, March 1974. The forward-backward algorithm can thus be applied for MAP decoding of linear block and convolutional codes.

The three aforementioned documents are hereby incorporated by reference.

On one hand, a drawback of the maximum-likelihood and MAP decoders is that the complexity to implement such decoders grows exponentially with the number of encoder states. Various solutions have appeared in the literature to reduce the complexity of the decoder trellis diagram, see, e.g., the reduced-state forward-backward algorithms described by G. Colavolpe, G. Ferrari, and R. Raheli in "Reduced-State BCJR-Type Algorithms," published in the IEEE Journal on Selected Areas in Communications, vol. 19, pp. 848–859, May 2001. In particular, an approximation of the a posteriori probabilities of the states and transitions in the decoder trellis diagram can be obtained at the end of the forward recursion of a reduced-state BCJR-type algorithm, with a substantial reduction of complexity, but such an approach would lead to a non negligible loss in performance. On the other hand, sequential decoders present the drawback that the number of computations C required for the decoding process to advance by one branch in the decoder tree is a random variable having a Pareto distribution; in other words, the probability that the number of computations C is larger than N is given by the following equation:

$$P[C>N]=AN^{-p}, \qquad (1)$$

where A and p are constants that depend on the channel characteristics and on the specific code and the specific version of the sequential decoding algorithm used.

As the number of computations per decoded symbol is not deterministic, real-time applications of sequential decoders require buffering of the received signal samples. Furthermore, as practical sequential decoders can perform only a finite number of operations in a given time interval, it is necessary to make provisions to avoid buffer overflow, which would have as a consequence incomplete decoding (erasures). If the buffer nears saturation, to avoid erasures it is necessary to reliably compute a state for restarting the sequential decoder, a procedure also known as resynchronization. In other words, resynchronization of the decoder must take place if the maximum number of operations that is allowed for decoding without incurring buffer saturation is exceeded.

Some solutions for resynchronization of the decoder are known, for example the buffer looking algorithm (BLA). In the BLA, the buffer is divided into L sections, each section having a size equal to $B_j, j=1, \ldots, L$. One conventional sequential decoder, generally named the primary decoder, and L−1 secondary decoders are used. The secondary decoders run fast algorithms, such as the so-called M-algorithm or variations of the Fano algorithm. For an in-depth description of the M-algorithm, someone skilled in the art may refer to the article "M-algorithm decoding of channel convolutional codes," by C. F. Lin and J. B. Anderson, published in the Conference Records of the Princeton Conf. Inform. Sci. Syst., Princeton, N.J., March 1986, pp. 362–365. In systems employing the BLA, the (L−1)-th secondary decoder, which is used to resynchronize the sequential decoder as the buffer nears saturation, is a hard-decision decoder. However, the BLA does not address satisfactorily the problem of possible errors in the resynchronization of the primary decoder. In fact, using a hard-decision decoder as a secondary decoder yields a low reliability of the recovered state. As a consequence, the sequential decoder will need with high probability a long sequence of received signal samples to resynchronize successfully, with the result of increasing the probability of repeated buffer saturation events and hence long erasures. Furthermore, sequential decoder resynchronization based on hard decisions is well suited only for the decoding of code sequences generated by encoders in systematic form, whereas this method cannot be applied if the encoders are in nonsystematic form. A definition of systematic and nonsystematic encoders is given in "Convolutional codes I: Algebraic structure," by G. D. Forney, Jr., published in the IEEE Transactions on Information Theory, vol. IT-16, pp. 720–738, November 1970.

U.S. Pat. No. 5,710,785 to T. Yagi describes a sequential decoder having short synchronization recovery time. Convolutional code symbols are sequentially stored into a first buffer at a transmission rate and read therefrom into a decoder where the symbols are decoded at a rate higher than the transmission rate and stored into a second buffer. A controller determines the likelihood of each decoded symbol in accordance with a predetermined likelihood algorithm and causes the decoded symbols to be read out of the second buffer in a backward direction into the decoder when the determination indicates a low likelihood value. When the first buffer is overflowed, the controller causes symbols to be read out of the first buffer into the decoder starting with a symbol which is k symbols older than the most recently received symbol and causes the decoder to shift its symbol timing by one clock interval, where k is an integer ranging from zero to a predetermined number which is smaller than the maximum number of symbols that can be stored in the first buffer. The method by Yagi, however, does not address the problem of reliably determining an initial state for the sequential decoder to restart operations. If the state to which the decoder is resynchronized is not correct, several consecutive overflows of the first buffer may occur, thus determining long erasures.

Thus there is still a need for a reliable solution to solve the problem of resynchronization of sequential decoders. Other coding techniques based on parallel concatenated convolutional codes or on low density parity check codes lead to better system performance in terms of bit error probability, however at the expense of significantly higher computational complexity, see for example the turbo code decoder with controlled probability estimate feedback described in U.S. Pat. No. 6,223,319 to J. A. F. Ross, S. M. Hladik, N. A. Van Stralen, and J. B. Anderson. Therefore several transmission systems of practical interest, such as the aforementioned SHDSL system, still employ convolutional codes or trellis codes that allow the application of low-complexity decoding techniques, such as sequential decoding.

SUMMARY OF THE INVENTION

In view of the foregoing and other problems of the prior art systems and methods, it is an object of the invention to provide a system and method for reliable resynchronization of sequential decoders based on probabilistic inference.

It is another object of the invention to provide a system that reduces the complexity of an auxiliary MAP algorithm that determines an initial state for the resynchronization of the primary sequential decoding algorithm.

It is a further object of the invention to provide a reliable estimate of the information bits by the reduced-complexity MAP auxiliary decoding algorithm while computing the state for the resynchronization of the primary sequential decoding algorithm, thus avoiding erasures.

These objects are achieved by the system and method of the appended claims.

In a preferred embodiment, the system for the resynchronization of a sequential decoder that decodes received signal samples stored within an input buffer comprises two auxiliary decoders coupled to the sequential decoder. The auxiliary decoders are chosen for running a simplified MAP decoding process when the input buffer reaches a threshold saturation level. Control of the respective increments of a read pointer and a write pointer allows to detect the saturation of the input buffer and to derive a sequence of signal samples to the appropriate auxiliary decoder. The selected auxiliary decoder estimates a resynchronization state for the sequential decoder based on the sequence of signal samples. According to the read and the write pointers value, normal sequential decoding is resumed otherwise the second auxiliary decoder is selected. And the selected auxiliary decoder estimates a resynchronization state for the sequential decoder based on a new sequence of signal samples.

Specifically, the method for resynchronization of a sequential decoder that decodes received signal samples stored within an input buffer, comprises when the input buffer reaches a threshold saturation level, the steps of:

a) stopping the sequential decoding process;
b) running a forward pass of a MAP decoding process on a first sequence of the signal samples to compute a first a posteriori probabilities of information bits associated to the first sequence of the signal samples and to estimate a first resynchronization state;
c) using the first a posteriori probabilities to determine a first reliability value of the first resynchronization state;
d) if the first reliability value is greater than a reliability threshold value, restarting the sequential decoding process at the first resynchronization state; otherwise
e) running a forward pass of a MAP decoding process on a second sequence of the signal samples to compute a second a posteriori probabilities of information bits associated to the second sequence of signal samples and to estimate a second resynchronization state;
f) using the second a posteriori probabilities to determine a second reliability value of the second resynchronization state;
g) if the second reliability value is greater than the reliability threshold value, restarting the sequential decoding process at the second resynchronization state; otherwise h) repeating steps e to h).

It is to be appreciated that various details of implementation are illustrated in the dependent claims.

BRIEF DESCRIPTION OF THE DRAWINGS

The above and other objects, features and advantages of the invention will be better understood by reading the following more particular description of the invention in conjunction with the sole accompanying FIG. 1 showing a block diagram of a sequential decoder according to a preferred embodiment of the invention.

DETAILED DESCRIPTION OF THE INVENTION

Figure 1:
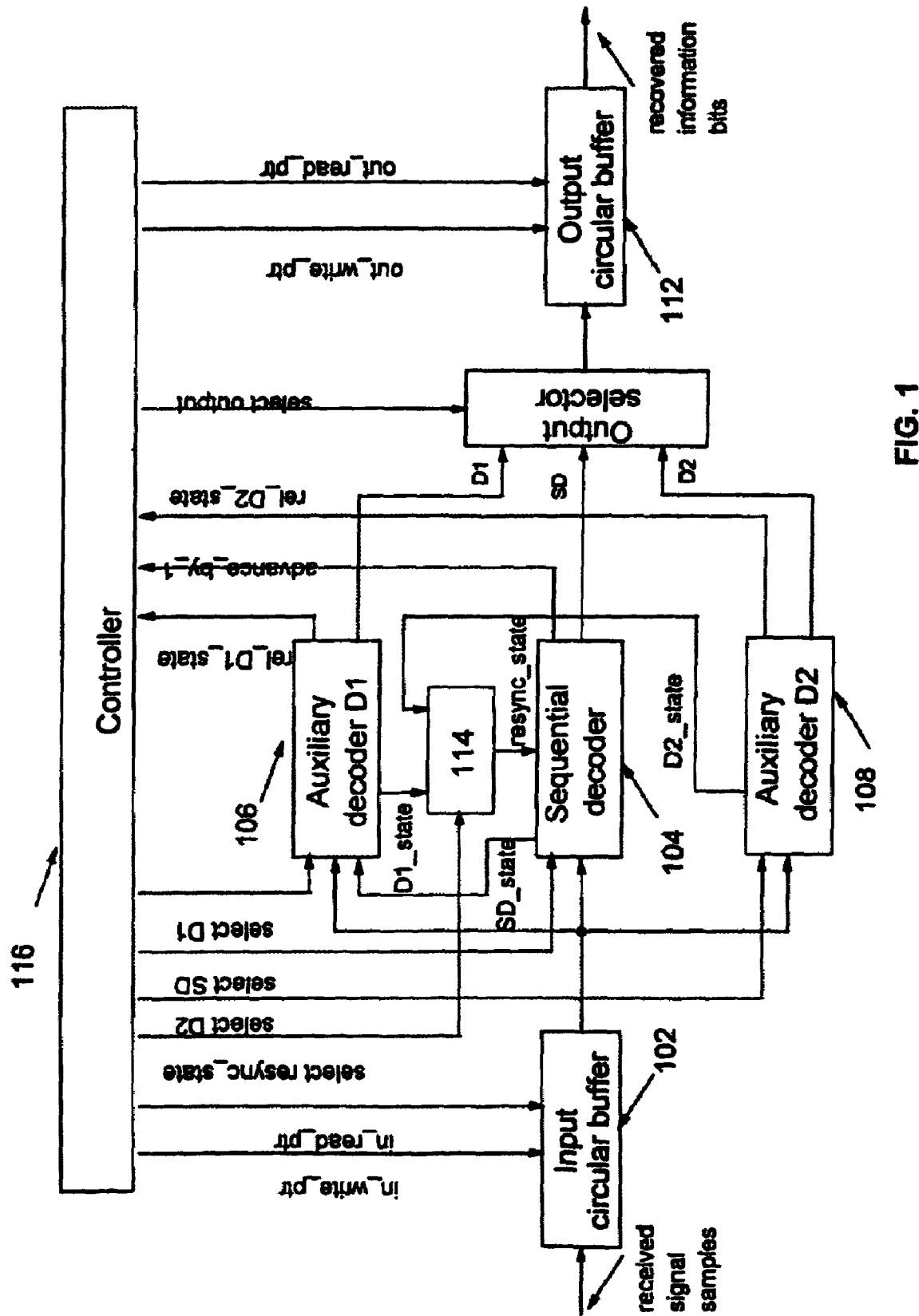

Referring first to FIG. 1, a block diagram of a preferred embodiment of the invention is described. Received signal samples are first input to a circular buffer 102, having $L_i$ memory locations. A sequential decoder 104 is connected to the input circular buffer by means of a signal samples line which is also input of a first auxiliary decoder 106 and of a second auxiliary decoder 108. The first and the second auxiliary decoders are preferably of the type reduced-state MAP decoders, but any general decoders that are able to provide a measure of the reliability of the state estimate could be used. One output of the sequential decoder (referenced SD on FIG. 1), of the first auxiliary decoder (referenced D1 on FIG. 1), and the second auxiliary decoder (referenced D2 on FIG. 1) are inputs of an output selector 110. The output selector is connected to an output circular buffer 112 to output the recovered information bits after the decoding process. A state selector 114 receives state information (respectively D1_state and D2_state) from the first and the second auxiliary decoders to generate a resynchronization information (denoted resync_state on FIG. 1) to the sequential decoder. All block circuits 102 to 114 operate under the control of a controller 116 as now described.

At a modulation interval of T, a new incoming sample is written into the input circular buffer 102 at one of the $L_i$ locations indicated by the value "in_write_ptr" of a write pointer of the input buffer. In application, for the SHDSL technology the maximum value of the modulation rate 1/T is equal to 774 kBaud. The value of the write pointer is then incremented every T seconds according to equation (2):

$$\text{in\_write\_ptr} \leftarrow (\text{in\_write\_ptr}+1) \bmod L_i \quad (2)$$

At the beginning of the system operations the value of the write pointer is set to:

$$\text{in\_write\_ptr} = (\text{in\_read\_ptr'}+1) \bmod L_i, \quad (3)$$

where "in_read_ptr'" denotes the initial value of a read pointer of the input buffer.

During normal operations, i.e. if the input buffer does not approach saturation, the signal samples are next transfer to the sequential decoder 104. The sequential decoder is characterized by a depth of search in the decoder tree equal to D. As previously explained, the number of operations needed by the sequential decoder to advance by one node in the decoder tree is a random variable. Whenever the decoder advances by one node in the decoder tree, the decoder outputs the vector of information bits corresponding to the transition from the previous state at depth D in the decoder tree to the new state at depth D. The sequential decoder conveys to controller 116 the information that the decoder tree has been extended by one node via a line denoted "advance_by_1".

Then the value of the read pointer of the input buffer is incremented to a new value through a line denoted "in_read_ptr". Provided the new value of "in_read_ptr" is not equal to "in_write_ptr", which would mean that the pointer points to a memory location containing a sample not yet transferred to the sequential decoder, the new value is defined as shown by equation (4):

$$\text{in\_read\_ptr} \leftarrow (\text{in\_read\_ptr}+1) \bmod L_i \quad (4).$$

Otherwise the increment of "in_read_ptr" takes place at the next modulation interval, after the increment of "in_write_ptr". Whenever an increment of "in_read_ptr" takes place, a new sample is input to the sequential decoder, corresponding to the memory location indicated by the new value of "in_read_ptr".

In practical applications, the length of the input buffer 102 is chosen larger than the depth of search, i.e. $L_i > D$. In the described embodiment of the invention, it is assumed that $L_i = 3D$.

During normal operations, the condition of $(\text{in\_read\_ptr} - \text{in\_write}_p\text{\_ptr}) \bmod L_i > D$ is verified. However, the sequential decoder may require a huge number of operations to advance by one node in the decoder tree. In that case, only the value of the write pointer of the input buffer is incremented during the corresponding computation time. And it could occur that the condition of equation (5):

$$(\text{in\_read\_ptr} - \text{in\_write\_ptr}) \bmod L_i = D \quad (5)$$

is achieved, which means that the input circular buffer has reached a threshold saturation level.

When equation (5) is met, controller 116 allows to select the first auxiliary decoder 106 in place of the sequential decoder 104.

To make the description more easily understandable, let us denote by $(\text{in\_read\_ptr}_0 - D + 1)\text{mod}L_i$ the index of the memory location where the sample corresponding to the transition from the current state at depth D in the decoder tree is stored, at the time the condition of equation (5) occurs.

All the samples stored in the memory locations of the input buffer having indices running from $(\text{in\_read\_ptr}_0 - D + 1)\text{mod}L_i$ to $(\text{in\_read\_ptr}_0 + D)\text{mod}L_i$ are next transferred to the first auxiliary decoder 106. A simplified MAP algorithm, which performs only the forward pass is then applied to the sequence of 2D samples, with an initial state (denoted SD) corresponding to the last node at depth D in the decoder tree of the sequential decoder.

It is well known that the number of operations performed by a MAP decoder, such as first auxiliary decoder, to process a sequence of 2D samples is a function of the number of states. It is assumed that the first auxiliary decoder 106 detects the vectors of information bits and estimates the final state (denoted D1_state) corresponding to the sequence of 2D samples in a time interval less than or equal to DT seconds; in practice the number of states of the first auxiliary decoder is chosen such that the sequence of 2D samples is decoded in a time interval less than or equal to DT seconds.

After the first auxiliary decoder outputs the estimate of the final state D1_state, the controller allows the selection of the sequential decoder 104 in place of the first auxiliary decoder. The controller also selects D1_state as being the initial state for the resynchronization of the sequential decoder through the resync_state line, and sets the value of the read pointer of the input circular buffer 102 to a value equal to $(\text{in\_read\_ptr}_0 + D + 1)\text{mod}L_i$. At this stage, two events can occur:

First event (E1): the sequential decoder advances in the decoder tree by D nodes before the write pointer of the input circular buffer achieves the value $(\text{in\_read\_ptr}_0 + D)\text{mod}L_i$. In this case, the controller outputs the information of a normal operation, and the decoding process runs in standard mode.

Second event (E2): the write pointer of the input circular buffer achieves the value $(\text{in\_read\_ptr}_0 + D)\text{mod}L_i$ before the sequential decoder advances in the decoder tree by D nodes. In this case the controller outputs the information that the input buffer approaches saturation. The second auxiliary decoder 108 is then selected. The skilled person will appreciate that the first auxiliary decoder is not selected, as no reliable initial state for MAP decoding is available.

The second auxiliary decoder when selected performs a reduced-complexity MAP algorithm by initially assuming equally likely states, and by reducing the number of states at each step in the forward pass by keeping only the most likely states. The 2D samples stored in the memory locations of the input circular buffer having indices running from $(\text{in\_read\_ptr}_0 + D + 1)\text{mod}L_i$ to $(\text{in\_read\_ptr}_0 + 3D)\text{mod}L_i$ are then transferred to the second auxiliary decoder. It is assumed that the second auxiliary decoder detects the vectors of information bits and estimates the final state (D2_state) corresponding to the sequence of 2D samples in a time interval less than or equal to DT seconds. In practice the number of states of the second auxiliary MAP decoder at each step in the forward pass is preferably chosen such that the sequence of 2D samples is decoded in a time interval less than or equal to DT seconds.

After the second auxiliary decoder outputs the estimate of the final state D2_state, the controller 116 allows the selection of the sequential decoder 104 in place of the second auxiliary decoder. The controller also selects D2_state as being the initial state for the resynchronization of the sequential decoder through the resync_state line, and sets the value of the read pointer of the input circular buffer 102 to a value equal to $(\text{in\_read\_ptr}_0 + 3D + 1)\text{mod}L_i$.

At this stage, the two events (E1) and (E2) previously described may occur. The process follows the operations as described above in case one or the other event occurs, with the value of the read pointer of the input buffer incremented by 2D (modulo $L_i$).

An important characteristic of MAP decoding is that the decoder may compute the reliability of the state estimates. The reliability information is used to simplify system operations as follows. If the reliability of D1_state is below a certain predetermined first threshold, or if the reliability of D2_state is below a certain predetermined second threshold, the controller immediately selects the second auxiliary decoder rather than selecting the sequential decoder, as it is likely that the state estimated for the resynchronization of the sequential decoder is not correct. It is to be appreciated that for a certain signal-to-noise ratio the value of a reliability threshold is chosen to achieve a tradeoff between the probability that the sequential decoder is resynchronized with a state that is not correct, and the probability that the second auxiliary decoder is immediately selected even though the state estimate is correct. The sequence of the next 2D samples is then directly transferred to the second auxiliary decoder which determines the vectors of information bits and provides an estimate of the new D2_state. This process is repeated until a state D2_state having a reliability above the second threshold is obtained. Then the controller selects again the sequential decoder, which is resynchronized with the reliable D2_state. The information about state reliability is conveyed to the controller by the first auxiliary decoder and by the second auxiliary decoder via the lines referenced as rel_D1_state and rel_D2_state respectively on FIG. 1.

The output circular buffer is preferably chosen having a number of memory locations $L_O$ greater than the number of memory locations $L_i$ of the input circular buffer in order to obtain a sequence of vectors of recovered information bits that is synchronous with the sequence of signal samples. A vector of recovered information bits is read from the location indicated by the value of an output read pointer (denoted "out_read_ptr") at every modulation interval T. The value of the read pointer is incremented every T seconds as shown by equation (6):

$$\text{out\_read\_ptr} \leftarrow (\text{out\_read\_ptr} + 1)\text{mod}L_O. \quad (6)$$

At the beginning of system operations, the value of the read pointer is set to:

$$\text{out\_read\_ptr} = (\text{out\_write\_ptr}' + 1)\text{mod } L_O, \quad (7)$$

where "out_write_ptr'" denotes the initial value of a write pointer of the output circular buffer. A vector of recovered information bits is first output from the output selector 110 which selects the appropriate decoder. Next, the vector is written into the output buffer 112 at a memory location indicated by the output write pointer "out_write_ptr", and the value of "out_write_ptr" is incremented by one (modulo $L_O$).

It is to be appreciated by those skilled in the art that while the invention has been particularly shown and described with reference to a preferred embodiment thereof, various changes in form and details may be made without departing from the spirit and scope of the invention.

The invention claimed is:

1. A method for resynchronization of a sequential decoder that decodes received signal samples stored within an input buffer, comprising when the input buffer reaches a threshold saturation level, the steps of:
   a) stopping a sequential decoding process;
   b) running a forward pass of a MAP decoding process on a first sequence of the signal samples to compute first a posteriori probabilities of information bits associated with the first sequence of the signal samples and to estimate a first resynchronization state;
   c) using the first a posteriori probabilities to determine a first reliability value of the first resynchronization state; and
   d) if the first reliability value is greater than a first reliability threshold value, restarting the sequential decoding process at the first resynchronization state otherwise:
      i) running a forward pass of a MAP decoding process on a second sequence of the signal samples to compute second a posteriori probabilities of information bits associated to the second sequence of signal samples and to estimate a second resynchronization state,
      ii) using the second a posteriori probabilities to determine a second reliability value of the second resynchronization state,
      iii) if the second reliability value is greater than a second reliability threshold value, restarting the sequential decoding process at the second resynchronization state, otherwise repeating step d (i) through d (iii).

2. A program storage device readable by a machine, tangibly embodying a program of instructions executable by the machine to perform method steps for resynchronization of a sequential decoder which decodes received signal samples stored within an input buffer comprising when the input buffer reaches a threshold saturation level, the steps of:
   a) stopping the sequential decoding process;
   b) running a forward pass of a MAP decoding process on a first sequence of the signal samples to compute first a posteriori probabilities of information bits associated with the first sequence of the signal samples and to estimate a first resynchronization state;
   c) using the first a posteriori probabilities to determine a first reliability value of the first resynchronization state,
   d) if the first reliability value is greater than a first reliability threshold value, restarting the sequential decoding process at the first resynchronization state, otherwise:
   e) running a forward pass of a MAP decoding process on a second sequence of the signal samples to compute second a posteriori probabilities of information bits associated with the second sequence of signal samples and to estimate a second resynchronization state;
   f) using the second a posteriori probabilities to determine a second reliability value of the second resynchronization state;
   g) if the second reliability value is greater than a second reliability threshold value, restarting the sequential decoding process at the second resynchronization state; otherwise
   h) repeating steps e) through h).

3. The method of claim 2 further comprising after step (c) the step c1) of using the first a posteriori probabilities to recover the information bits associated with the first sequence of signal samples.

4. The method of claim 2 further comprising after step (f) the step of using the second a posteriori probabilities to recover the information bits associated with the second sequence of signal samples.

5. The method of claim 2 wherein the value of the threshold saturation level is equal to the value of the depth of search of the sequential decoder.

6. The method of claim 5 further comprising the step (a1) of selecting a first sequence of signal samples within the signal samples stored in the input buffer, said first sequence of the signal samples comprising a number of signal samples equal to the value of the depth of search of the sequential decoder.

7. The method of claim 6 further comprising after step (a1) the step (a2) of sending said first sequence of signal samples to a first auxiliary decoder.

8. The method of claim 6 further comprising after step d) the step d1) of selecting a second sequence of signal samples within the signal samples stored in the input buffer said second sequence of signal samples comprising a number of signal samples equal to the value of the depth of search of the sequential decoder.

9. The method of claim 8 further comprising after step (d1) the step d2) of sending said second sequence of signal samples to a second auxiliary decoder.

10. The method of claims 6 wherein the first and the second sequences of signal samples comprise a number of signal samples equal to two times the value of the depth of search of the sequential decoder.

11. The method of claim 2 wherein the first and the second reliability threshold values are chosen to obtain a predetermined probability of an event that the sequential decoder is resynchronized with a state that is not correct.

12. A sequential decoding system for resynchronizing a sequential decoder which decodes received signal samples stored in an input buffer, said system comprising: when the input buffer reaches a threshold saturation level
   a) means for stopping the sequential decoding process;
   b) means for running a forward pass of a MAP decoding process on a first sequence of the signal samples to compute a first a posteriori probabilities of information bits associated with the first sequence of the signal samples and to estimate a first resynchronization state;
   c) means for using the first a posteriori probabilities to determine a first reliability value of the first resynchronization state;
   d) means for, if the first reliability value is greater than a first reliability threshold value, restarting the sequential decoding process at the first resynchronization state, otherwise for:
      (i) running a forward pass of a MAP decoding process on a second sequence of the signal samples to compute a second a posteriori probabilities of information bits associated to the second sequence of signal samples and to estimate a second resynchronization state,
      (ii) using the second a posteriori probabilities to determine a second reliability value of the second resynchronization state,
      (iii) if the second reliability value is greater than a second reliability threshold value, restarting the sequential decoding process at the second resynchronization state, otherwise, if the second reliability value is less than or equal to a second reliability threshold value, repeating steps d(i) through d(iii).

* * * * *